(12) United States Patent
Juschkin et al.

(10) Patent No.: US 11,499,924 B2
(45) Date of Patent: Nov. 15, 2022

(54) DETERMINING ONE OR MORE CHARACTERISTICS OF LIGHT IN AN OPTICAL SYSTEM

(71) Applicant: KLA Corporation, Milpitas, CA (US)

(72) Inventors: Larissa Juschkin, Pleasanton, CA (US); Konstantin Tsigutkin, Pleasanton, CA (US)

(73) Assignee: KLA Corp., Milpitas, CA (US)

( * ) Notice: Subject to any disclaimer, the term of this patent is extended or adjusted under 35 U.S.C. 154(b) by 237 days.

(21) Appl. No.: 16/885,211

(22) Filed: May 27, 2020

(65) Prior Publication Data

US 2020/0378901 A1 Dec. 3, 2020

Related U.S. Application Data

(60) Provisional application No. 62/856,398, filed on Jun. 3, 2019.

(51) Int. Cl.
*G01N 21/95* (2006.01)
*G01N 21/33* (2006.01)
(Continued)

(52) U.S. Cl.
CPC ........ *G01N 21/9505* (2013.01); *G01J 1/0411* (2013.01); *G01J 1/0474* (2013.01); *G01J 1/429* (2013.01); *G01J 1/4228* (2013.01); *G01J 1/4257* (2013.01); *G01N 21/33* (2013.01); *G01N 21/956* (2013.01); *G01N 23/20* (2013.01); *G03F 1/84* (2013.01); *G01J 2001/444* (2013.01); *G01N 2021/335* (2013.01);
(Continued)

(58) Field of Classification Search
CPC ...... G01J 1/0411; G01J 1/0474; G01J 1/4228; G01J 1/4257; G01J 1/429; G01J 2001/444; G01J 2021/335; G01J 2021/95676; G01J 21/33; G01J 21/9505; G01J 21/956; G01J 2201/0636; G01J 2223/052; G01J 23/20; G03F 1/84
See application file for complete search history.

(56) References Cited

U.S. PATENT DOCUMENTS 8,842,272 B2 9/2014 Wack et al.
9,671,548 B2 6/2017 Wald et al.
(Continued)

FOREIGN PATENT DOCUMENTS

JP 2010-261951 11/2010
JP 6249513 12/2017

OTHER PUBLICATIONS

International Search Report for PCT/US2020/035629 dated Sep. 28, 2020.

*Primary Examiner* — Mark R Gaworecki
(74) *Attorney, Agent, or Firm* — Ann Marie Mewherter (57) ABSTRACT

Methods and systems for determining one or more characteristics of light in an optical system are provided. One system includes first detector(s) configured to detect light having one or more wavelengths shorter than 190 nm emitted from a light source at one or more first angles mutually exclusive of one or more second angles at which the light is collected from the light source by an optical system for illumination of a specimen and to generate first output responsive to the light detected by the first detector(s). In addition, the system includes a control subsystem configured for determining one or more characteristics of the light at one or more planes in the optical system based on the first output.

27 Claims, 5 Drawing Sheets

(51) Int. Cl.
  *G01N 23/20* (2018.01)
  *G01J 1/04* (2006.01)
  *G01J 1/42* (2006.01)
  *G03F 1/84* (2012.01)
  *G01N 21/956* (2006.01)
  *G01J 1/44* (2006.01)

(52) U.S. Cl.
  CPC ............ *G01N 2021/95676* (2013.01); *G01N 2201/0636* (2013.01); *G01N 2223/052* (2013.01)

(56) References Cited

U.S. PATENT DOCUMENTS

| | | |
|---|---|---|
| 2003/0043370 A1 | 3/2003 | Goldberg |
| 2010/0165310 A1 | 7/2010 | Sewell et al. |
| 2010/0284511 A1 | 11/2010 | Zocchi et al. |
| 2013/0271749 A1 | 10/2013 | Korb et al. |
| 2015/0029498 A1 | 1/2015 | Guan et al. |
| 2015/0192459 A1 | 7/2015 | Kvamme |
| 2015/0253658 A1 | 9/2015 | Terasawa et al. |
| 2016/0320708 A1 | 11/2016 | Lu et al. |
| 2017/0256045 A1 | 9/2017 | Miyai et al. |
| 2018/0276812 A1 | 9/2018 | Kohyama et al. |
| 2019/0331611 A1 | 10/2019 | Ebstein |
| 2020/0107428 A1 | 4/2020 | Tong et al. |
| 2020/0117102 A1 | 4/2020 | Liu et al. |
| 2020/0124995 A1 | 4/2020 | Nijmeijer et al. |
| 2020/0142324 A1 | 5/2020 | Staals et al. |

DETERMINING ONE OR MORE CHARACTERISTICS OF LIGHT IN AN OPTICAL SYSTEM

BACKGROUND OF THE INVENTION

1. Field of the Invention

This invention generally relates to methods and systems for determining one or more characteristics of light in an optical system.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a photomask to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

With the performance of 193 nm immersion lithography reaching its limit as well as the substantially high cost and yield issues associated with multi-patterning lithography processes, extreme ultraviolet (EUV) lithography has been under extensive development and is used for next generation lithography (NGL) technology to extend Moore's law, driving computer chips to be smaller, faster, and more efficient.

Defectivity control of EUV photomasks, which define the patterns printed on wafers, plays a critical role from a process yield management perspective. However, it has been regarded as one of the high risk areas of EUV lithography development due to the lack of actinic EUV photomask or high throughput charged particle beam inspection tools that can inspect the photomask at the necessary resolution. Although there are a few products now on the market that provide relatively high speed actinic EUV patterned mask inspection, these inspectors are relatively complex for a number of reasons that are not a factor in mask inspection at longer wavelengths.

The geometries on EUV masks require inspection systems with relatively high image fidelity and substantially low detection noise to resolve the defect features that can cause performance degradation of the integrated circuits fabricated from these masks in EUV lithography. The EUV spectral range, however, presents many new challenges to the optical and system design of an inspection tool due to the short wavelength, energetic photons, and low radiance (brightness) of laboratory (i.e., relatively compact) EUV radiation sources. The precise knowledge of spatial incident intensity distribution within the illumination field at the mask is essential for image analysis in the inspection tool.

Existing reference correction methods for EUV mask inspection are based on one of the following procedures. Some reference correction methods include monitoring spatially integrated source power at one or several locations within the pupil. Other reference correction methods include monitoring two-dimensional source/illumination brightness distribution by imaging the source with reference pick-up in the illumination beam path.

There are, however, a number of disadvantages to the previously used EUV reference correction methods and systems. For example, spatially integrated source power does not provide any information on changes in spatial distribution of illumination intensity. Monitoring just source power is not sufficient when working with inherently unstable and jittering sources. In another example, placing pick-up optics in the illumination beam path introduces distortions and uncertainties of illumination profile at the specimen. It also reduces overall photon flux available for the inspection. In addition, unlike longer wavelength systems, there are no efficient beam splitters available for use in EUV systems, which complicates any pick-up optics configuration.

Accordingly, it would be advantageous to develop systems and/or methods for determining one or more characteristics of light in an optical system that do not have one or more of the disadvantages described above.

SUMMARY OF THE INVENTION

The following description of various embodiments is not to be construed in any way as limiting the subject matter of the appended claims.

One embodiment relates to a system configured for determining one or more characteristics of light in an optical system. The system includes one or more first detectors configured to detect light having one or more wavelengths shorter than 190 nm emitted from a light source at one or more first angles mutually exclusive of one or more second angles at which the light is collected from the light source by an optical system for illumination of a specimen and to generate first output responsive to the light detected by the one or more first detectors. In addition, the system includes a control subsystem configured for determining one or more characteristics of the light at one or more planes in the optical system based on the first output. The system may be further configured as described herein.

Another embodiment relates to a system configured for determining information for a specimen. The system includes a light source configured for generating light having one or more wavelengths shorter than 190 nm. The system also includes one or more first detectors configured to detect the light emitted from the light source at one or more first angles and to generate first output responsive to the light detected by the one or more first detectors. In addition, the system includes one or more second optical elements configured to collect the light emitted from the light source at one or more second angles mutually exclusive of the one or more first angles, to direct the light collected at the one or more second angles to a specimen, and to direct the light from the specimen to one or more second detectors configured to generate second output responsive to the light from the specimen. The system further includes a computer subsystem configured to determine information for the specimen based on the second output. The system also includes a control subsystem configured for determining one or more characteristics of the light at one or more planes in the path of the light collected at the one or more second angles based on the first output and for altering at least one of one or more parameters of the light source, one or more parameters of the one or more second optical elements, one or more parameters of the one or more second detectors, and one or more parameters used by the computer subsystem to determine the information based on the determined one or more characteristics. The system may be further configured as described herein.

Another embodiment relates to a computer-implemented method for determining one or more characteristics of light in an optical system. The method includes detecting light having one or more wavelengths shorter than 190 nm emitted from a light source at one or more first angles with one or more first detectors that generate first output responsive to the light detected by the one or more first detectors. The one or more first angles are mutually exclusive of one or more second angles at which the light is collected from the light source by an optical system for illumination of a specimen. The method also includes determining one or more characteristics of the light at one or more planes in the optical system based on the first output.

Each of the steps of the method described above may be performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for determining one or more characteristics of light in an optical system. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to methods and systems for reference correction in optical systems such as extreme ultraviolet (EUV) mask inspection systems. Although some embodiments are described herein with respect to the inspection of semiconductor photomasks (or "reticles"), specifically masks used in EUV lithography, the embodiments are not limited to such uses. The advantages described herein that the embodiments provide for EUV mask inspectors would also be advantages for the other systems described herein.

The geometries on EUV masks require inspection systems with substantially high image fidelity and substantially low detection noise to resolve the defect features that can cause performance degradation of the integrated circuits fabricated from these masks in an EUV scanner. These inspection tools preferably operate at the same wavelength that is used to image the masks in the scanner. The EUV spectral range presents many challenges to the optical and system design of an inspection tool due to the short wavelength, energetic photons, and relatively low radiance (brightness) of laboratory (i.e., relatively compact) EUV radiation sources. The precise knowledge of the spatial distribution of the incident intensity within the illumination field at the mask is essential for image analysis in the inspection tool. The embodiments described herein provide ways for monitoring and correcting incident intensity spatial distribution within the illumination field for unevenness of brightness of a light source in image data used for inspection of an EUV mask (reference correction). In addition, the embodiments described herein provide a way to increase image fidelity and therefore the performance of an inspection system without an equivalent increase in cost or complexity of the optics and radiation source.

One embodiment relates to a system configured for determining one or more characteristics of light in an optical system. In one embodiment, the light is extreme ultraviolet (EUV) light. In another embodiment, the light is vacuum ultraviolet (VUV) light. In a further embodiment, the light is soft x-rays. For example, the light may be EUV light having a wavelength of about 13.5 nm, one or more wavelengths in a range of about 10 nm to about 124 nm, or one or more wavelengths in a range of about 5 nm to about 30 nm, another VUV light having one or more wavelengths less than 190 nm (meaning that the optical system must be operated in a vacuum to prevent the light from being absorbed by the atmosphere), or soft x-rays having a wavelength of about 0.12 nm to about 5 nm. The light source may include any suitable light source known in the art capable of emitting light at one or more of these wavelengths. Such light sources include, but are not limited to, laser-induced plasma sources, discharge-induced plasma sources, cathode/ anode type sources, etc. In addition, the embodiments described herein can be used with any light source (e.g., plasma-based) emitting light into a relatively broad angular range, used for one or more of the applications described further herein, e.g., inspection, metrology, defect review, and lithography.

The system includes one or more first detectors configured to detect light having one or more wavelengths shorter than 190 nm emitted from a light source at one or more first angles mutually exclusive of one or more second angles at which the light is collected from the light source by an optical system for illumination of a specimen and to generate first output responsive to the light detected by the one or more first detectors. One embodiment of a system configured for determining one or more characteristics of light in an optical system is shown in FIG. 1.

Figure 1:
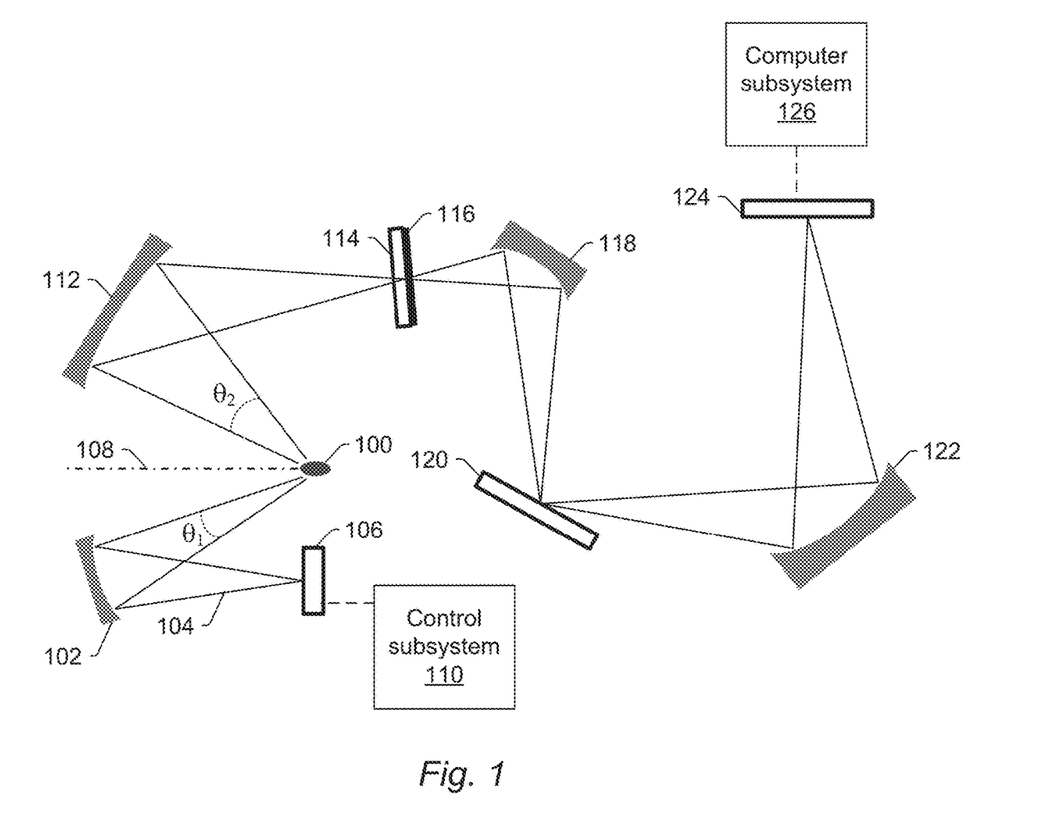
FIGS. 1 and 4 are schematic diagrams illustrating side views of embodiments of a system configured for determining one or more characteristics of light in an optical system.

As shown in FIG. 1, the system may include one or more first optical elements 102 configured to direct (or image) light 104 from light source 100 onto first detector(s) 106. The first detector(s) may be installed in the light source compartment (not shown). Although one or more first optical elements 102 are shown in FIG. 1 as a single, concave reflective optical element, in practice, first optical element(s) 102 may include any suitable number and configuration of reflective and/or other optical elements. In addition, although first detector(s) 106 are shown in FIG. 1 as a single detector, the first detector(s) may include any suitable number of detector(s), e.g., 1 detector, 2 detectors, 3 detectors, etc., each of which may have the same or different configurations. If the first detector(s) include more than one detector, each of the detectors may be positioned in the same image plane but at different positions within the image plane so as to detect separately different portions of the light directed to the image plane. Such configurations of more than one first detector may be determined based on, for example, the dimensions of the illuminated field in the imaging plane, the characteristics of the specimen, and the configuration of the second detector(s), all of which are described further herein.

In another embodiment, the one or more first detectors include one or more two-dimensional (2D) detectors. For example, the one or more first detectors may include one or more reference 2D detectors such as charge coupled devices (CCD cameras) or time delay integration (TDI) cameras. In this manner, the one or more first detectors may detect light as a function of position within the image plane. Although 2D detectors may be particularly suitable for use in the embodiments described herein, it may be possible to use other types of detectors as well. For example, if there is a known and stable illumination profile/source image, instead of a 2D detector, position sensitive detector(s) may be used as the one or more first detectors.

The detector(s) may also include non-imaging detector(s) or imaging detector(s). If the first detector(s) are non-imaging detector(s), each of the detector(s) may be configured to detect certain characteristics of the light such as intensity but may not be configured to detect such characteristics as a function of position within the imaging plane. As such, the output that is generated by each of the detector(s) may be signals or data, but not image signals or image data. In such instances, a computer subsystem such as computer subsystem 126 may be configured to correct images of the specimen based on information from the non-imaging output of the detector(s). However, in other instances, the detector(s) may be configured as imaging detector(s) that are configured to generate imaging signals or image data. Therefore, the system may be configured to generate output and/or images described herein in a number of ways.

Although the system is shown in FIG. 1 (and other figures described further herein) as including one or more first optical elements configured for directing the light from the light source to the one or more first detectors, the system may or may not include the one or more first optical elements. For example, in a simplified case, e.g., if only total power is of interest, first optical elements(s) 102 shown in FIG. 1 can be the detector itself or a spectral thin-film filter applied onto a detector. If source imaging is needed, a pinhole camera may perform well enough in the short EUV/soft x-ray wavelength range. Therefore, optical element(s) 102 shown in FIG. 1 do not need to be a mirror but instead can be the one or more first detectors.

The reference signal is collected at an angle outside the illumination beam path. For example, as shown in FIG. 1, one or more first optical elements 102 may collect light emitted from light source 100 at a range of angles $\theta_1$, and the light emitted from the light source at a range of angles 62 is collected for illumination of specimen 120. As can be seen in FIG. 1, therefore, the light detected by first detector(s) 106 is collected at one or more first angles $\theta_1$ that are outside of the one or more second angles $\theta_2$ at which light is collected for illumination of the specimen. The embodiments described herein therefore take advantage of the relatively wide angular spread of the light emitted from light sources that can generate light in the wavelengths described herein. In addition, unlike previously used systems and methods for EUV reference correction, the embodiments described herein are configured for reconstruction of an image viewed through illumination optics from an off-illumination path image.

In one embodiment, an optical path of the light between the light source and the one or more first detectors is not spatially coincident with an optical path of the light between the light source and the specimen. In other words, the light that is detected by the first detector(s) does not travel along the same path as the light used for illumination of the specimen, which is different than some currently used systems and methods for EUV reference correction that pick off a portion of the light collected for specimen illumination. In addition, there are no common elements in the path of the light that is detected by the one or more first detectors and the path of the light that is used for illumination of the specimen. For example, unlike currently used systems that pick off a portion of the light collected for illumination of the specimen for reference monitoring and correction purposes, the light that is detected for reference correction and monitoring in the embodiments described herein is not acted upon by any of the optical elements that collect and direct light from the light source to the specimen. Because the optical elements involved in reference monitoring and correction are mutually exclusive of the optical elements involved in specimen illumination, the overall configuration of the optical elements in the system embodiments described herein may be simpler than the optical elements in currently used systems and methods.

In another embodiment, the light source is configured to emit the light at the one or more first angles and the one or more second angles simultaneously. For example, the embodiments described herein are particularly suitable for use with light sources that emit light at a relatively wide angular range simultaneously (e.g., at the least the first angle(s) and the second angle(s) simultaneously). Therefore, the embodiments do not include any optical elements that modulate the light between illumination of the specimen and reference monitoring and correction. In particular, if the light source emits light at a relatively wide angular range, the reference correction and monitoring performed by the embodiments described herein can use so-called "wasted" light, i.e., light that is emitted by the light source but is not, for any of a variety of reasons, collected for specimen illumination. Therefore, the light used for reference monitoring and correction can be collected and detected at the same time that the light is collected and directed to the specimen for illumination.

In a further embodiment, the one or more first detectors are configured for detecting the light at the one or more first angles while the optical system collects the light at the one or more second angles and directs the light collected at the one or more second angles to the specimen for the illumination of the specimen. For example, the system may be configured to direct the light onto the one or more first detectors in real time (exposure-to-exposure or in scanning TDI mode). In this manner, the embodiments described herein provide real-time light source monitoring in combination with TDI scanning. In addition, the embodiments described herein may be configured for measuring EUV dose over projected pixel area on the specimen during every exposure.

In some embodiments, the one or more first angles and the one or more second angles have mirror symmetry with respect to an axis of symmetry of the light source. In other embodiments, the one or more first angles and the one or more second angles do not have mirror symmetry with respect to an axis of symmetry of the light source. For example, as shown in FIG. 1, first angle(s) $\theta_1$ and second angle(s) $\theta_2$ may have mirror symmetry about axis 108 of symmetry of light source 100. The first and second angle(s) do not however have to have mirror symmetry with respect to axis 108. For example, if the first and second angle(s) have mirror symmetry with respect to the axis of symmetry of the light source, the steps performed by the control subsystem described further herein may be simpler than if the first and second angle(s) do not have mirror symmetry. However, any spatial relationship between the first and second angle(s) and the axis of symmetry can be accounted for in the step(s) performed by the control subsystem.

Figure 2:
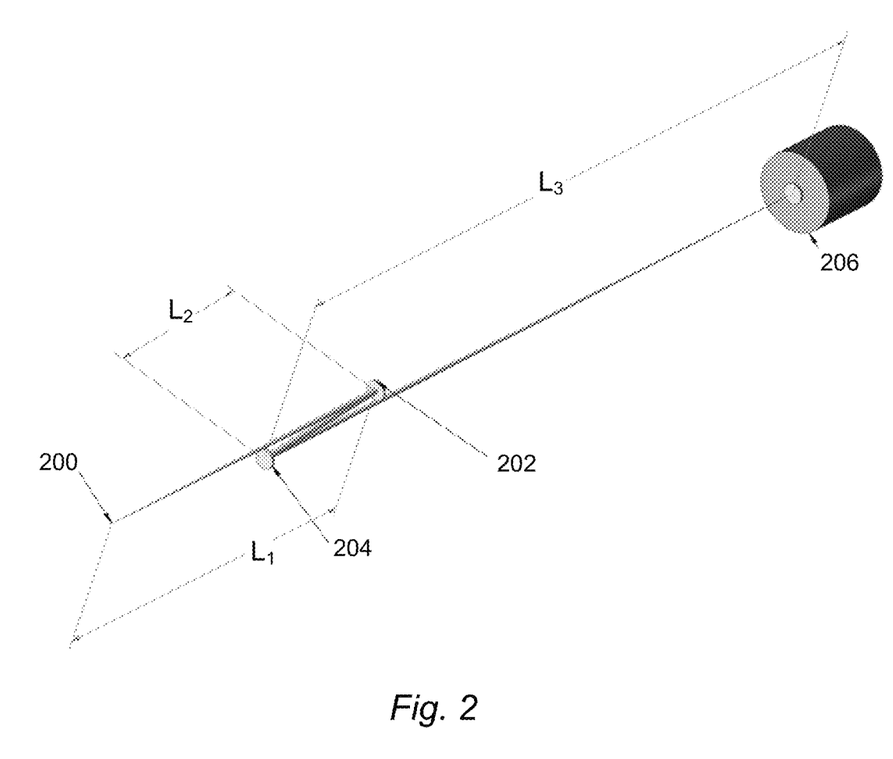
FIG. 2 is a schematic diagram illustrating a perspective view of an embodiment of a system configured for determining one or more characteristics of light in an optical system.

FIG. 2 illustrates another embodiment of a system configured for determining one or more characteristics of light in an optical system. In this embodiment, the system includes one or more first detectors 206 configured to detect light having one or more wavelengths shorter than 190 nm emitted from light source 200 at one or more first angles (not shown in FIG. 2) mutually exclusive of one or more second angles (not shown in FIG. 2) at which the light is collected from the light source by an optical system (not shown in FIG. 2) for illumination of a specimen (not shown in FIG. 2) and to generate first output responsive to the light detected by the one or more first detectors.

This embodiment of the system may or may not include first optical elements 202 and 204. Optical element 202 collects light from light source 200 at the one or more first angles and directs the light to optical element 204. The system may include an aperture (not shown) with a filter such as a $Si_3N_4$/Zr filter (or another filter suitable for the 13.5 nm wavelength in the case of actinic mask inspection or review application) positioned in the path of the light between the light source and optical element 202. Optical element 202 may be a multilayer, flat mirror. Optical element 204 directs the light to first detector(s) 206. Optical element 204 may be a multi-layer, spherical mirror. Detector 206 may be a complementary metal oxide semiconductor (CMOS) image sensor or CCD camera with a deposited Ce:$Y_3Al_5O_{12}$(Ce:YAG) scintillator or $Gd_2O_2S$:Tb (P43) phosphor screen. First optical elements 202 and 204 and first detector 206 may be further configured as described herein.

The optical path lengths between the elements shown in FIG. 2, e.g., length L between light source 200 and optical element 202, length L2 between optical element 202 and optical element 204, and length $L_3$ between optical element 204 and detector 206, may be determined based on the configuration of the light source, the optical elements, and the detector. The system shown in FIG. 2 may include any other elements described herein.

In some embodiments described further herein, the system may include elements configured for illuminating the specimen and for possibly detecting light from the specimen. For example, the embodiment of the system shown in FIG. 1 may include one or more second optical elements configured for collecting the light emitted from light source 100 at second angle(s) 02, directing light collected at the second angle(s) to specimen 120 and for directing light from the specimen to one or more second detectors 124 configured to generate second output responsive to the light from the specimen. In the embodiment shown in FIG. 1, the second optical element(s) include optical elements 112, 118, and 122, and possibly homogenizer 114. Optical element 112 is configured to collect light from light source 100 at the second angle(s) and to direct the light through optional homogenizer 114 positioned at intermediate field plane 116 to optical element 118. Optical element 118 is configured for directing the light collected by optical element 112 and possibly exiting optional homogenizer 114 to specimen 120. Light from specimen 120 is collected by optical element 122 that directs the light from the specimen to one or more second detectors 124.

Although each of optical elements 112, 118, and 122 is shown in FIG. 1 as a single, concave reflective optical element, each of these optical elements may include any suitable number of optical elements having any suitable configuration. Optional homogenizer 114 may also have any suitable configuration known in the art. The angle(s) at which optical element 112 collects light from the light source may vary depending on the characteristics of the light source, characteristics of the specimen, and the purpose of specimen illumination. In addition, the angle(s) at which optical element 118 directs light to specimen 120 may vary based on similar variables. For example, if the system is configured for lithography in which a pattern is being transferred from specimen 120 to another specimen, the system may be configured for illuminating specimen 120 with light at different angles than if the system was configured for inspection, metrology, or defect review of specimen 120. Furthermore, the angle(s) at which optical element 122 collects light from specimen 120 and directs or images the light to one or more second detectors 124 may vary depending on the characteristics of the specimen and the light directed to it for illumination, which will affect the characteristics of the light from the specimen, and the configuration of the system such as what kind of light (e.g., scattered, specularly reflected, etc.) is being directed to the one or more second detectors. The light from the specimen that is collected by the second optical element(s) may include scattered light, specularly reflected light, diffracted light, etc., or some combination thereof.

The system may also include a scanning subsystem (not shown) configured to cause the light to be scanned over the specimen. For example, the system may include a stage (not shown) on which specimen 120 is disposed. The scanning subsystem may include any suitable mechanical and/or robotic assembly (that includes the stage) that can be configured to move the specimen such that the light can be scanned over the specimen. In addition, or alternatively, the system may be configured such that the one or more second optical elements perform some scanning of the light over the specimen. The light may be scanned over the specimen in any suitable fashion.

The one or more second detectors may include any suitable detectors known in the art including those described herein. In general, the one or more second detectors may be imaging detector(s) such as CCD cameras or TDIs although non-imaging detectors may also be used. In addition, although second detector(s) 124 are shown in FIG. 1 as a single detector, the second detector(s) may include any suitable number of detector(s), e.g., 1 detector, 2 detectors, 3 detectors, etc., each of which may be configured the same or differently. If the second detector(s) include more than one detector, each of the detectors may be positioned in the same image plane but at different positions within the image plane so as to detect separately different portions of the light directed to the image plane. Such configurations of more than one second detector may be determined based on, for example, the dimensions of the illuminated field in the imaging plane, the characteristics of the specimen, and the configuration of the second detector(s).

Figure 4:
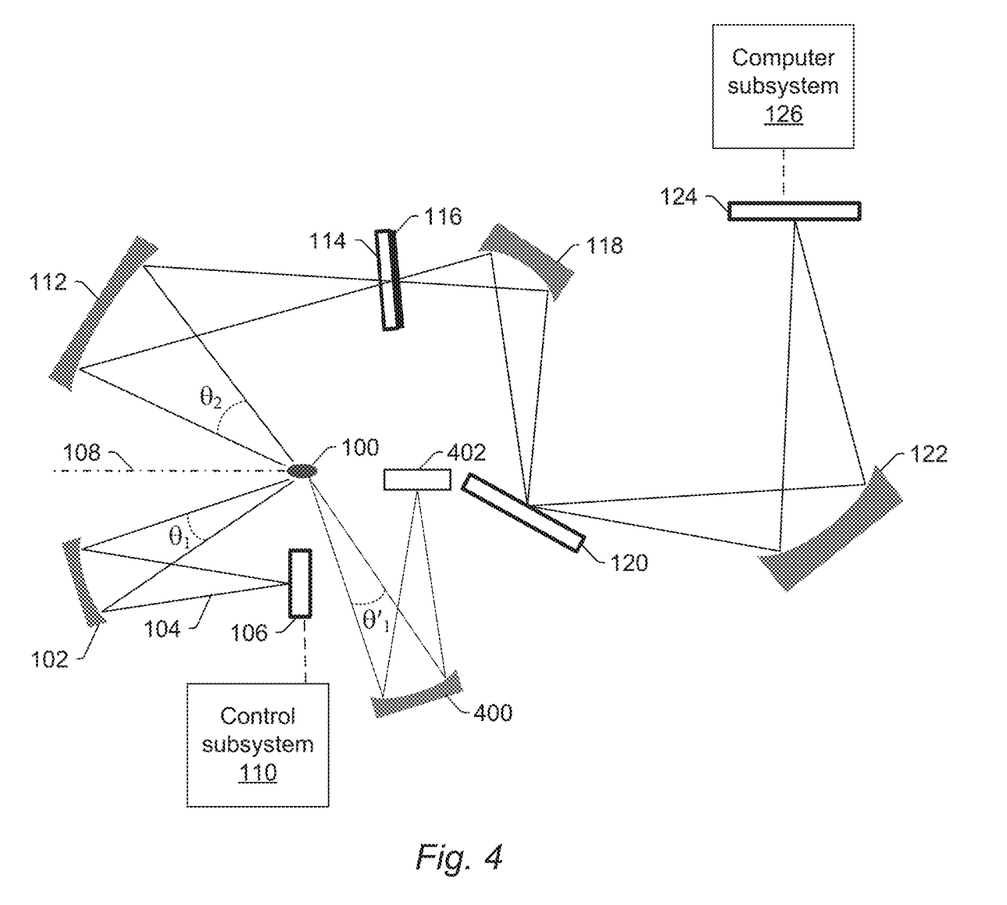

It is noted that FIG. 1, as well as FIGS. 2 and 4 described further herein, are provided to generally illustrate some configurations of optical elements and detectors that may be included in the system embodiments described herein. Obviously, the optical element and detector configurations described herein may be altered to optimize the performance of the system as is normally performed when designing a commercial system. In addition, the systems described herein may be implemented using an existing optical system (e.g., by adding the one or more first detectors and other functionality described herein to an existing optical system) such as the actinic EUV pattern mask inspection tool ACTIS A150, which is commercially available from Lasertec Corporation, Yokahama, Japan. For some such systems, the embodiments described herein may be provided as optional functionality of the existing system (e.g., in addition to other functionality of the system). Alternatively, the system described herein may be designed "from scratch" to provide a completely new system.

The system also includes a control subsystem configured for determining one or more characteristics of the light at one or more planes in the optical system based on the first output. Therefore, the embodiments described herein may use the first output (e.g., source images) captured at one or more angles, which are outside of the collector solid angle used for specimen illumination, to predict one or more characteristics of the light such as light distribution at a pupil and/or field of the optical system, which may be performed using the first output in combination with modeling and calibration measurements. For example, as shown in FIG. 1, the system may include control subsystem 110 coupled to first detector(s) 106. The control subsystem may include one or more computer subsystems and possibly other elements described herein such as firmware, a servo loop, and any other suitable controller type elements known in the art.

Control subsystem 110 may be coupled to the one or more first detectors in any suitable manner (e.g., via one or more transmission media, which may include "wired" and/or "wireless" transmission media) such that the control subsystem can receive the output, images, etc. generated by the first detector(s). Control subsystem 110 may be configured to perform a number of functions using the output, images, etc. of the first detector(s) as described herein and any other functions described further herein. This control subsystem may be further configured as described herein.

The control subsystem may include one or more computer subsystems that are configured to perform one or more functions of the control subsystem such as determining the one or more characteristics of the light at the one or more planes in the optical system. The one or more computer subsystems of the control subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, a computer subsystem of control subsystem 110 may be coupled to computer subsystem 126 by any suitable transmission media (not shown), which may include any suitable wired and/or wireless transmission media known in the art. Two or more of such computer subsystems may also be effectively coupled by a shared computer-readable storage medium (not shown).

In some embodiments, the control subsystem is configured for determining the one or more characteristics of the light using a tomographic technique and an optical model of the optical system. For example, the first output (e.g., a recorded 2D source image (projection)) may be used to reconstruct the spatial distribution of the emitted radiation by employing tomographic techniques and optical system symmetries. The computer subsystem may then propagate the spatial distribution through the optical model of the optical system to predict the illumination profile. In this way, the control subsystem can map the reference detector signal (first detector(s) output) to the specimen which can be used for substantially fast compensation of any source induced variations within the illumination field or any other imaging plane in the system. In this manner, the embodiments described herein may employ tomographic algorithms combined with an optical model of an illuminator for calibrating and predicting (monitoring) specimen intensity distribution.

In some such embodiments, illumination mapping from source images (i.e., images generated by the first detector(s) or using output generated by the first detector(s)) may include generating a source model and/or calibrating a source model. For example, an initial source model may be used to simulate images (projections) that would be detected by the first detector(s). Images of the light source may also be obtained in experiments using the first detector(s). The simulated and experimentally acquired images may be used to generate a source model and/or to setup or calibrate one or more parameters of an existing source model, which may describe various parameters of the source such as distribution (e.g., Gaussian) and various source dimensions such as diameter, length, etc. The generated or calibrated source model can then be used for mapping the images to one or more planes in the optical system such as a pupil (for homogenizer) or a field (for critical illumination). In this manner, the control subsystem may use a combination of modeling and calibration experiments for map generation. In addition, the mapping described herein will have a unique mathematical solution in the case of light source symmetry although such symmetry is not required in the embodiments described herein.

In another embodiment, the one or more characteristics include a spatial incident intensity distribution within an illumination field at the specimen. For example, the one or more first detectors may capture an image of the light source (the plasma of the light source). The control subsystem may then computationally transform the image to the field power distribution. For example, the control subsystem may perform numerical ray tracing (mapping) using a ray distribution function obtained from the source image and transfer matrix (model) of the optical system. In particular, simulating ray transfer of the optical system may include inputting the ray distribution into an ABCD ray transfer matrix for each optical element in the optical system, which will output a ray distribution. The control subsystem may then estimate (predict) the intensity distribution at the field plane (the illumination field at the specimen plane) and/or the pupil plane of the optical system. In the case of critical illumination, source images are sufficient. For other illumination schemes, depending on the design choices and complexity of illumination optics, knowledge of angular distribution of emission may also be taken into consideration. Angular distribution is expected to be more stable and can be measured separately as part of a calibration (e.g., performed using one or more calibration detectors as described herein). In addition, vibrations and drifts of individual optics may have an impact and therefore may be monitored and accounted for (e.g., as variations of transfer matrix).

In a further embodiment, determining the one or more characteristics includes determining a three-dimensional (3D) spatial incident intensity distribution of the light source and determining the one or more characteristics at the specimen from the 3D spatial incident intensity distribution. For example, the first output (e.g., a recorded 2D source image (projection)) may be used to reconstruct the spatial distribution of the emitted radiation in 3D by employing tomographic techniques and optical system symmetries. The computer subsystem may then propagate the 3D distribution through the optical model of the inspection system to predict the illumination profile. In this way, the control subsystem can map the reference detector signal (first detector(s) output) to the specimen which can be used for substantially fast compensation of any source induced variations within the illumination field.

Figure 3:
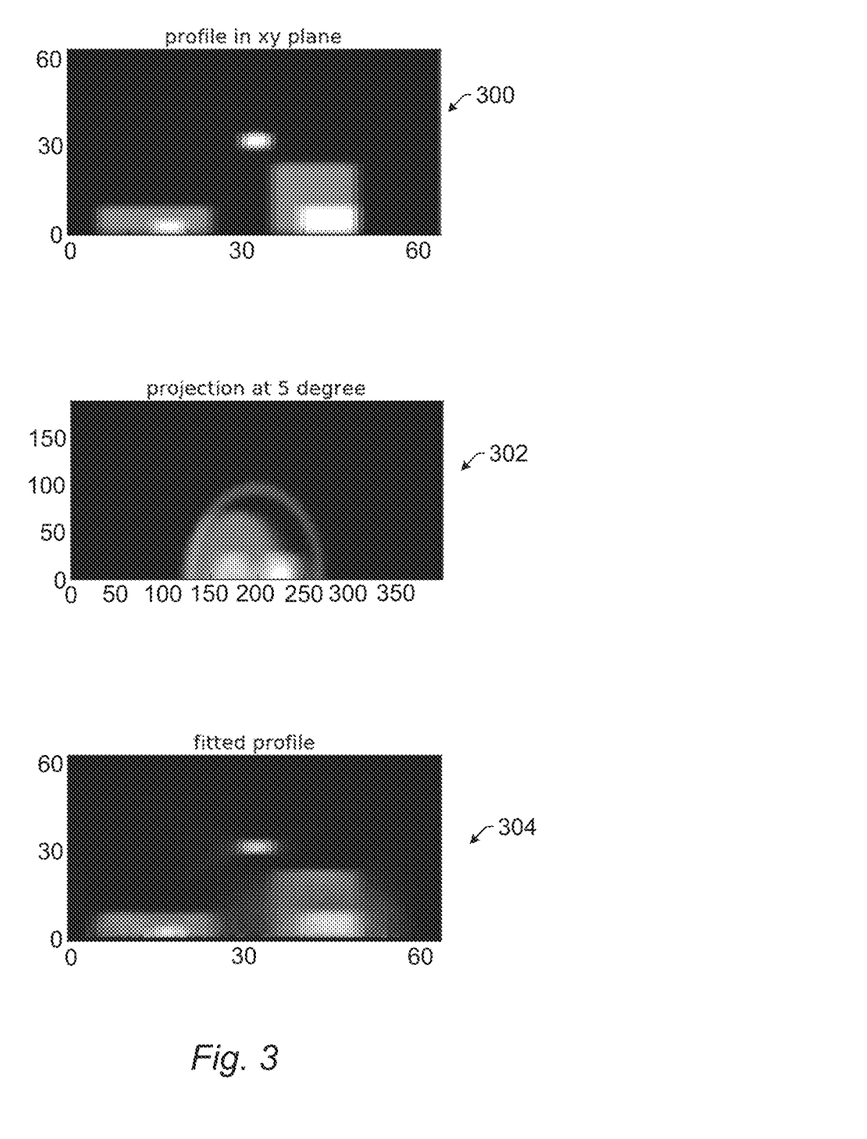
FIG. 3 includes examples of different illumination profiles generated by the inventors showing feasibility of determining one or more characteristics of light in an optical system as described herein.

In the case of 3D reconstruction and a plasma based light source, one of the characteristics that may be determined by the control subsystem is a characteristic responsive to how the plasma moves. One of the difficulties in determining such characteristics is that imaging of the light source destroys one spatial dimension (depth). One solution for mitigating this difficulty is to make an assumption of rotational symmetry, rendering one spatial dimension trivial. The projection can then be $X \cdot \beta = y$, where X is the projection matrix, $\beta$=coefficients (profile pixel brightness), and y=image in the detector plane. FIG. 3 includes various results produced by the inventors to illustrate such 3D reconstruction. Profile 300 is an artificial test profile (i.e., a simulated profile in the xy plane). Profile 302 is a projection to a camera plane (5° off axis). In other words, profile 302 may be generated by the one or more first detectors. Given that profile, the control subsystem may reconstruct fitted profile 304 by a technique such as linear least squares minimization. In this manner, the output generated by the one or more first detectors can be used by the control subsystem to calculate the one or more characteristics of the light source at any angle.

In an additional embodiment, the one or more characteristics include one or more spatial and temporal characteristics. For example, monitoring the 2D light source brightness distribution as described herein enables correction for variation of the illumination profile in temporal and spatial domains. In particular, the first detector(s) may generate output at different points in time (whether that is intermittently or continuously) and at different points in time relative to the illumination of the specimen (e.g., prior to illumination of the specimen, during illumination of the specimen, and/or after illumination of the specimen). More specifically, because the one or more first detectors generate output responsive to the light collected at the first angle(s) without affecting the performance of the optical system, the first detectors may generate output that is responsive to both time and spatial characteristics of the light source. That configuration enables the control subsystem to determine the spatial and temporal characteristic(s) of the light source from the first output, which can then be used to determine both spatial and temporal changes to one or more parameters of the optical system as described further herein.

In some embodiments, the control subsystem is configured for altering one or more parameters of the optical system based on the determined one or more characteristics. For example, control subsystem 110 may include firmware (not shown) and a servo loop (not shown). The firmware and servo loop may have any suitable configuration known in the art suitable for comparing the determined one or more characteristics to a predetermined range of values for the determined one or more characteristics and then altering a parameter of at least one of the light source, one or more second optical elements, and/or one or more second detectors in response thereto. In one such example, the one or more determined characteristics may include computed field power distribution, and the control subsystem may be configured for altering the one or more parameters of the optical system by applying corrections to the optical system based on any variation in the computed field power distribution from expected.

The parameter(s) of the optical system that are altered by the control subsystem may include any parameter that can cause a change in the characteristic(s) of the light at the one or more planes in the optical system, some examples of which are described further herein and which may vary depending on the configuration of the optical system. The alterations to the parameter(s) of the optical system may be determined in any suitable manner (e.g., experimentally or theoretically) using any suitable type of control loop, algorithm, method, function, etc.

The parameter(s) of the optical system that are altered by the control subsystem may also include any parameter of any element that performs a function or step using output of the detector(s) of the optical system. For example, the parameter(s) that are altered may include one or more parameters of a computer subsystem (e.g., computer subsystem 126 shown in FIG. 1) or one or more parameters of a method, step, algorithm, process, etc. performed by the computer subsystem on the output generated by one or more second detectors 124. Such parameter(s) may include parameter(s) of image processing performed to correct the images generated by the second detector(s) for any variations in the light source. In one such example, the determined one or more characteristics of the light may be spatial and temporal characteristics in the brightness of the light at the specimen plane. If such characteristic(s) show temporal changes, the control subsystem may determine one or more corrections to specimen images that can be made in the image processing performed by the computer subsystem to mitigate any effects that the temporal changes have on the specimen images. Therefore, the one or more parameters of the optical system that are controlled in response to the determined characteristic(s) may be optical parameters and/or image processing parameters.

Any of the information determined as described herein can be used for monitoring and controlling the source conditions (size, position, brightness, etc.). Sharing the same optical elements (e.g., the first detector(s) and possibly the first optical element(s)) for this function and determining the characteristic(s) of the light in the optical system reduces the number of necessary sensors and monitors in the optical system. In addition, as described herein, the embodiments may be configured for measuring EUV dose over projected pixel area on the specimen during every exposure. Therefore, the embodiments described herein can provide correction factors for each pixel in the one or more second detectors (each pixel in a TDI column). Some EUV mask inspection systems use multiple detectors (shown generically in FIG. 1 as one or more second detectors 124) to image several subfields on a mask (i.e., a first detector images a first sub-field, a second detector images a second sub-field, and so on). Therefore, in some systems, estimates of light distribution are needed for several sub-fields on the specimen. Since the embodiments described herein can collect and detect light emitted from the light source at a relatively large range of angles and can predict the spatial distribution of the light at various planes in the optical system, the embodiments described herein can provide pixel level information for each of the various sub-fields on the specimen that are imaged by the optical system.

In another embodiment, the control subsystem is configured for outputting the determined one or more characteristics to a computer subsystem of the optical system, and the computer subsystem is configured for altering one or more parameters of the optical system based on the determined one or more characteristics. For example, the control subsystem itself may not necessarily determine corrections and/or alterations to the optical system. Instead, the control subsystem may simply output the determined one or more characteristics in any suitable manner and in any suitable format to another system or method such as computer subsystem 126 that determines alterations to one or more parameters of the optical system based on the determined one or more characteristics and alters the one or more parameters based on that determination. In other words, the control of the optical system based on the determined one or more characteristics of the light may be distributed across multiple subsystems such as the control subsystem and a computer subsystem. However, the control subsystem may also be part of the computer subsystem or vice versa so that one subsystem both determines the characteristic(s) of the light and alters one or more parameters of the optical system based on the characteristic(s). The computer subsystem may alter the one or more parameters of the optical system as described further herein.

In a further embodiment, the system also includes one or more calibration detectors configured for detecting the light collected at the one or more second angles and directed to the specimen by the optical system, and the control subsystem is configured for calibrating the output of the one or more first detectors based on the light detected by the one or more calibration detectors. For example, the output of the one or more first detectors (e.g., an obtained 2D map) can be calibrated with respect to a separately measured intensity distribution at the specimen by associating any distortions at the specimen plane with any distortions of the first detector(s) output. The embodiments described herein are therefore different from previously used methods and systems for EUV reference correction in that the embodiments described herein can use separately obtained source images for monitoring and calibration of illumination profile.

The calibration detector(s) may be included in the system at the specimen plane. For example, specimen 120 shown in FIG. 1 may be replaced with one or more calibration detectors (not shown), e.g., by swapping out the specimen for one or more calibration detectors. The specimen and the calibration detector(s) may be swapped out in any suitable manner. Therefore, depending on whether the specimen or the calibration detector(s) are being illuminated, element 120 shown in FIG. 1 may be either a specimen or calibration detector(s). The calibration detector(s) may include any of the detectors described herein in any suitable configuration. For example, the calibration detector(s) may include multiple 2D detectors positioned at different positions in the same imaging plane. The calibration detector(s) output may be used to calibrate the first output using any suitable calibration technique known in the art.

In a similar manner, the specimen may be swapped out with a reference (i.e., a fiducial). For example, the system may be configured to replace specimen 120 with a reference having some known optical characteristics, which may include materials, structures, unpatterned or patterned, etc., having some known reflective, scattering, diffractive, etc. characteristics. The reference is therefore represented by element 120 in FIG. 1 when the specimen is replaced by the reference. Light that is collected from the reference by the one or more second optical elements and directed to the one or more second detectors 124 may be used in a number of ways. For example, the reference may include one or more features that can be detected at the one or more second detectors for optical system alignment purposes. The reference may also include one or more materials or structures that make it suitable for use as a calibration standard. In this way, the light from the reference detected by the one or more second detectors may be used for calibration of the optical system and possibly also the one or more first optical elements, the one or more first detectors, and the control subsystem. In this manner, the calibration may be performed using the reference for both the optical system and the reference monitoring and correction subsystem.

In some embodiments, the system includes one or more additional first detectors configured to detect the light emitted from the light source at one or more additional first angles mutually exclusive of the one or more first angles and the one or more second angles and to generate additional first output responsive to the light detected by the one or more additional first detectors, and the control subsystem is configured for determining the one or more characteristics of the light at the one or more planes based on the first output and the additional first output. In other words, the system may include more than one set of reference correction optics, each configured to detect the light emitted at angles different than the other set(s) of reference correction optics and mutually exclusive of the angles at which light is collected for specimen illumination.

One such embodiment is shown in FIG. 4. In this embodiment, the system includes one or more additional first detectors 402 configured to detect the light emitted from light source 100 at one or more additional first angles, $\theta'_1$, mutually exclusive of one or more first angles, $\theta_1$, and one or more second angles, $\theta_2$, and to generate additional first output responsive to the light detected by the one or more additional first detectors. Control subsystem 110 may be coupled to one or more additional first detectors 402 as described further herein such that the control subsystem can receive output generated by the one or more additional first detectors. The additional reference correction optics may be further configured as described herein. For example, as shown in FIG. 4, the system may include one or more additional first optical elements 400 configured to collect light emitted from light source 100 at the one or more additional first angles and to direct the collected light to one or more additional first detectors 402. Each of the elements shown in FIG. 4 may be further configured as described herein.

The control subsystem may be configured for determining the one or more characteristics of the light at the one or more planes based on the first output and the additional first output in combination. For example, the control subsystem may use the ray distribution measured by both the first detector(s) and the additional first detector(s) as input to an ABCD ray transfer matrix for each optical element in the optical system thereby outputting a ray distribution at one or more planes in the optical system. Other calculations described herein may be performed in a similar manner, e.g., using both the output from the first detector(s) and the additional first detector(s) as input.

The output of the first detector(s) and the additional first detector(s) may also or alternatively be used separately to determine one or more characteristics of the light at the one or more planes, and the one or more characteristics determined using output from different detectors may be the same characteristics or different characteristics. For example, the output from the first detector(s) may be better suited to determine a first characteristic of the light at one or more planes, and the output from the additional first detector(s) may be better suited to determine a second characteristic different from the first at the one or more planes. In a similar manner, output from different detectors may be more or less suitable for determining the same or different characteristics of the light at different planes in the optical system (e.g., a pupil plane vs. an illumination plane). Furthermore, the output generated by different detectors may be separately used by the control subsystem to determine one or more characteristics of the light at a plane in the optical system, and then the separately determined characteristics may be combined in some manner to determine another characteristic of the light at the plane. In general, separately detecting light emitted from the light source at different angles of emission can increase and/or improve the information that can be determined about the light in the optical system from the output of the detectors.

In some instances, the system may also include one or more other optical elements (not shown) and/or one or more other detectors (not shown) that are configured for detecting a portion of the light collected by the one or more second optical elements. For example, the system may include a pick-off mirror (not shown) positioned at intermediate image plane 116 that is configured to reflect a relatively small portion of the light at the intermediate image plane out of the illumination path and to one or more other optical elements and/or one or more other detectors that are configured to detect the light. The other optical elements and other detectors may have any suitable configuration known in the art, some examples of which are described in U.S. Patent Application Publication No. 2018/0276812 to Kohyama et al. (and corresponding Japanese Patent No. 6249513 published Dec. 20, 2017), which is incorporated by reference as if fully set forth herein. The embodiments described herein may be further configured as described in this publication. The output generated by the one or more other detectors that is responsive to the light detected by those detectors may be used in combination with the output generated by the one or more first detectors to determine one or more characteristics of the light at one or more planes in the path of the light collected by the one or more second optical elements (e.g., at a specimen plane, an intermediate image plane, a detector plane, etc.).

The embodiments described herein have a number of advantages over other methods and systems for monitoring and controlling light sources that emit light in the wavelength ranges described herein. For example, monitoring 2D source brightness distribution enables correction for variations of the illumination profile in temporal and spatial domains, significantly improving image fidelity when working with unstable and jittering sources. In addition, placing the reference pick-up (the first detector(s) and any optical elements coupled thereto) outside of the illumination beam path of the optical system avoids obscuration of the illumination beam and reduces distortions of the illumination profile at the specimen. The embodiments described herein also increase the overall photon flux available for inspection within the etendue of the optical system. Furthermore, the embodiments described herein provide a reduction in the number of monitoring sensors that are needed because the same sensors may be used for monitoring and controlling the light source. Moreover, the embodiments described herein enable optimization of the performance of EUV mask inspection and other systems described herein.

In one embodiment, the specimen is a reticle. The reticle may include any reticle known in the semiconductor arts including any reticle that is configured for use in a VUV lithography process, an EUV lithography process, or a soft x-ray lithography process. The reticle may also be a reticle for use in another lithography process (e.g., 193 nm lithography), when there is some advantage to performing one of the processes described herein (e.g., inspection, metrology, defect review) at a wavelength less than 190 nm. In another embodiment, the specimen is a wafer. The wafer may include any wafer known in the semiconductor arts. Although some embodiments may be described herein with respect to a reticle, the embodiments are not limited in the specimen for which they can be used. For example, the embodiments described herein may be used for specimens such as flat panels, personal computer (PC) boards, and other semiconductor specimens.

In one embodiment, the optical system is configured as an inspection system. For example, the optical system may be configured for generating output that is suitable for detecting defects on the specimen. In such an embodiment, computer subsystem 126 shown in FIG. 1 may be configured for detecting defects on specimen 120 by applying a defect detection method to the output generated by second detector(s) 124. Computer subsystem 126 may be coupled to second detector(s) 124 as described further herein so that it can receive the output generated by the second detector(s). Detecting defects on the specimen may be performed in any suitable manner known in the art (e.g., applying a defect detection threshold to the output and determining that any output having a value above the threshold corresponds to a defect (or a potential defect)) with any suitable defect detection method and/or algorithm. If the specimen that is being inspected is a reticle, the wavelength(s) of light used to illuminate the reticle may be the same as the wavelength(s) of light that the reticle will be used with in a lithography process. In other words, the inspection system may be configured as an actinic reticle inspection system although it may also or alternatively be configured for non-actinic reticle inspection. In embodiments in which the optical system is configured for inspection, the embodiments may be further configured as described in U.S. Patent Application Publication Nos. 2010/0165310 by Sewell et al. published Jul. 1, 2010, 2015/0192459 by Kvamme published Jul. 9, 2015, 2015/0253658 by Terasawa et al. published Sep. 10, 2015, and 2019/0331611 by Ebstein published Oct. 31, 2019, which are incorporated by reference as if fully set forth herein. The embodiments described herein may be further configured as described in these publications.

In another embodiment, the optical system is configured as a metrology system. In a further embodiment, the optical system is configured as a defect review system. In particular, the embodiments of the system described herein and shown in FIGS. 1 and 4 may be modified in one or more parameters to provide different imaging capability depending on the application for which it will be used. In one such example, the optical system shown in FIG. 1 may be configured to have a higher resolution if it is to be used for metrology rather than for inspection. In other words, the embodiments of the optical system shown in FIGS. 1 and 4 describe some general and various configurations for an optical system that can be tailored in a number of manners that will be obvious to one skilled in the art to produce systems having different imaging capabilities that are more or less suitable for different applications.

In this manner, the optical system may be configured for generating output that is suitable for re-detecting defects on the specimen in the case of a defect review system and for measuring one or more characteristics of the specimen in the case of a metrology system. In a defect review system embodiment, computer subsystem 126 shown in FIG. 1 may be configured for re-detecting defects on specimen 120 by applying a defect re-detection method to the output generated by second detector(s) 124 and possibly determining additional information for the re-detected defects using the output generated by the second detector(s). In a metrology system embodiment, computer subsystem 126 shown in FIG. 1 may be configured for determining one or more characteristics of specimen 120 using the output generated by the second detector(s). In both cases, computer subsystem 126 may be coupled to second detector(s) 124 as described further herein so that it can receive the output generated by the second detector(s).

Defect review typically involves re-detecting defects detected as such by an inspection process and generating additional information about the defects at a higher resolution, e.g., using the optical system described herein in a high magnification mode. Defect review is therefore performed at discrete locations on the specimen where defects have been detected by inspection. The higher resolution data for the defects generated by defect review is generally more suitable for determining attributes of the defects such as profile, roughness, more accurate size information, etc. Computer subsystem 126 may be configured to determine such information for defects on the specimen in any suitable manner known in the art.

Metrology processes are used at various steps during a semiconductor manufacturing process to monitor and control the process. Metrology processes are different than inspection processes in that, unlike inspection processes in which defects are detected on a specimen, metrology processes are used to measure one or more characteristics of the specimen that cannot be determined using currently used inspection tools. For example, metrology processes are used to measure one or more characteristics of a specimen such as a dimension (e.g., line width, thickness, etc.) of features formed on the specimen during a process such that the performance of the process can be determined from the one or more characteristics. In addition, if the one or more characteristics of the specimen are unacceptable (e.g., out of a predetermined range for the characteristic(s)), the measurements of the one or more characteristics of the specimen may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a specimen may be independent of the results of an inspection process performed on the specimen. In particular, the locations at which a metrology process is performed may be selected independently of inspection results. In addition, since locations on the specimen at which metrology is performed may be selected independently of inspection results, unlike defect review in which the locations on the specimen at which defect review is to be performed cannot be determined until the inspection results for the specimen are generated and available for use, the locations at which the metrology process is performed may be determined before an inspection process has been performed on the specimen. Computer subsystem 126 may be configured to determine any suitable characteristics for the specimen in any suitable manner known in the art.

In an additional embodiment, the optical system is configured as a lithography tool. In lithography, reference correction does not exist in the same form as in other optical systems described herein. However, in lithography, there is also a need to predict and control exposure dose (and its uniformity) at the wafer/photoresist, which may be commonly referred to as "dose control." Data that can be used for dose control can be obtained using the embodiments described herein.

In embodiments in which the optical system is configured as a lithography tool, specimen 120 may be a reticle or mask, and the wafer or other specimen that is being patterned in the lithography process may be placed at the position of second detector(s) 124 shown in FIG. 1. In this manner, in normal usage, the lithography tool may not include second detector(s) but would include a specimen in that position. In other words, in embodiments of the system in which the optical system is configured as a lithography tool, element 124 shown in FIG. 1 would be a specimen that is being patterned rather than the one or more second detectors described herein.

In some lithography tools, one or more detectors may be placed in the plane of the specimen being patterned for one or more functions such as alignment of the reticle or mask, alignment of the lithography tool optics, alignment of the specimen being patterned to the reticle or mask, monitoring of the light source or other lithography tool optical elements, control of the light source or other lithography tool optics, etc. In some such tools, the specimen being patterned may be replaced with one or more detectors, such as the one or more second detector(s) described herein, or such detector(s) may be coupled to one or more elements of the lithography tool such as the stage (not shown) that supports and moves the specimen being patterned.

In such tools, the reference correction and control systems described herein (e.g., the one or more first detectors and the control subsystems described herein) may be used in combination with such other control subsystems, may be incorporated into such other control subsystems, may include such other control subsystems, etc. In other words, the embodiments described herein may be used with any existing control subsystems of the lithography tool to provide additional optical system monitoring and control. In this manner, the embodiments described herein may be incorporated into existing lithography tools such as those commercially available from ASML Netherlands B.V., Veldhoven NL and tools described in U.S. Patent Application Publication Nos. 2016/0320708 by Lu et al. published Nov. 3, 2016, 2020/0107428 by Tong et al. published Apr. 2, 2020, 2020/0117102 by Liu et al. published Apr. 16, 2020, 2020/0124995 by Nijmeijer et al. published Apr. 23, 2020, and 2020/0142324 by Staals et al. published May 7, 2020, which are incorporated by reference as if fully set forth herein. The embodiments described herein may be further configured as described in these publications.

In any of the system embodiments described herein, computer subsystem 126 shown in FIG. 1 may be configured to generate results that include at least the information determined for the specimen based on the second output possibly with any other output generated by the computer subsystem. The results may have any suitable format (e.g., a KLARF file, which is a proprietary file format used by tools commercially available from KLA Corp., Milpitas, Calif., a results file generated by Klarity, which is a tool that is commercially available from KLA, a lot result, etc.). In addition, all of the embodiments described herein may be configured for storing results of one or more steps of the embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. to perform one or more functions for the specimen or another specimen.

Such functions include, but are not limited to, altering a process such as a fabrication process or step that was or will be performed on the specimen in a feedback, feedforward, in-situ manner, etc. For example, the computer subsystem may be configured to determine one or more changes to a process that was or will be performed on the specimen based on the detected defect(s) and/or other determined information. The changes to the process may include any suitable changes to one or more parameters of the process. For example, if the determined information is defects detected on the specimen, the computer subsystem preferably determines those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem may determine such changes in any suitable manner known in the art.

Those changes can then be sent to a semiconductor fabrication system (not shown) or a storage medium (not shown in FIG. 1) accessible to both the computer subsystem and the semiconductor fabrication system. The semiconductor fabrication system may or may not be part of the system embodiments described herein. For example, the systems described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

Another embodiment relates to a system configured for determining information for a specimen. The system includes a light source, e.g., light source 100 shown in FIG. 1, configured for generating light having one or more wavelengths shorter than 190 nm. The system also includes one or more first detectors, e.g., first detector(s) 106 shown in FIG. 1, configured to detect the light emitted from the light source at one or more first angles, e.g., $\theta_1$ shown in FIG. 1, and to generate first output responsive to the light detected by the one or more first detectors. In addition, the system includes one or more second optical elements, e.g., second optical element(s) 112, 118, and 122 shown in FIG. 1, configured to collect the light emitted from the light source at one or more second angles, e.g., $\theta_2$ shown in FIG. 1, mutually exclusive of the one or more first angles, to direct the light collected at the one or more second angles to a specimen, e.g., specimen 120 shown in FIG. 1, and to direct the light from the specimen to one or more second detectors, e.g., second detector(s) 124 shown in FIG. 1, configured to generate second output responsive to the light from the specimen.

The system further includes a computer subsystem, e.g., computer subsystem 126 shown in FIG. 1, configured to determine information for the specimen based on the second output. The system also includes a control subsystem, e.g., control subsystem 110 shown in FIG. 1, configured for determining one or more characteristics of the light at one or more planes in the path of the light collected at the one or more second angles based on the first output and for altering at least one of one or more parameters of the light source, one or more parameters of the one or more second optical elements, one or more parameters of the one or more second detectors, and one or more parameters used by the computer subsystem to determine the information based on the determined one or more characteristics. This embodiment of the system may be further configured as described herein.

Each of the embodiments of the systems described above may be further configured according to any other embodiment(s) described herein. The embodiments described herein may also be further configured as described in U.S. Pat. No. 8,842,272 to Wack et al. and U.S. Pat. No. 9,671,548 to Wald et al., which are incorporated by reference as if fully set forth herein.

Another embodiment relates to a computer-implemented method for determining one or more characteristics of light in an optical system. The method includes detecting light having one or more wavelengths shorter than 190 nm emitted from a light source at one or more first angles with one or more first detectors that generate first output responsive to the light detected by the one or more first detectors. The one or more first angles are mutually exclusive of one or more second angles at which the light is collected from the light source by an optical system for illumination of a specimen. The method also includes determining one or more characteristics of the light at one or more planes in the optical system based on the first output.

Each of the steps of the method may be performed as described further herein. The method may also include any other step(s) that can be performed by the system(s) described herein. The steps of the method may be performed by the systems described herein, which may be configured according to any of the embodiments described herein.

Figure 5:
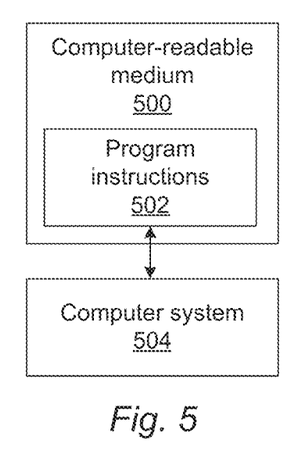
FIG. 5 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for determining one or more characteristics of light in an optical system. One such embodiment is shown in FIG. 5. In particular, as shown in FIG. 5, non-transitory computer-readable medium 500 includes program instructions 502 executable on computer system 504. The computer-implemented method may include any step(s) of any method(s) described herein.

Program instructions 502 implementing methods such as those described herein may be stored on computer-readable medium 500. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 504 may be configured according to any of the embodiments described herein.

Further modifications and alternative embodiments of various aspects of the invention will be apparent to those skilled in the art in view of this description. For example, methods and systems for determining one or more characteristics of light in an optical system are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for determining one or more characteristics of light in an optical system, comprising:
one or more first detectors configured to detect light having one or more wavelengths shorter than 190 nm emitted from a light source at one or more first angles mutually exclusive of one or more second angles at which the light is collected from the light source by an optical system for illumination of a specimen and to generate first output responsive to the light detected by the one or more first detectors, wherein the light detected by the one or more first detectors is not acted upon by any optical elements that collect and direct the light from the light source to the specimen; and
a control subsystem configured for determining one or more characteristics of the light at one or more planes in the optical system based on the first output.

2. The system of claim 1, wherein an optical path of the light between the light source and the one or more first detectors is not spatially coincident with an optical path of the light between the light source and the specimen.

3. The system of claim 1, wherein the light source is configured to emit the light at the one or more first angles and the one or more second angles simultaneously.

4. The system of claim 1, wherein the one or more first detectors are further configured for detecting the light at the one or more first angles while the optical system collects the light at the one or more second angles and directs the light collected at the one or more second angles to the specimen for the illumination of the specimen.

5. The system of claim 1, wherein the one or more first angles and the one or more second angles have mirror symmetry with respect to an axis of symmetry of the light source.

6. The system of claim 1, wherein the one or more first angles and the one or more second angles do not have mirror symmetry with respect to an axis of symmetry of the light source.

7. The system of claim 1, further comprising one or more additional first detectors configured to detect the light emitted from the light source at one or more additional first angles mutually exclusive of the one or more first angles and the one or more second angles and to generate additional first output responsive to the light detected by the one or more additional first detectors, wherein the control subsystem is further configured for determining the one or more characteristics of the light at the one or more planes based on the first output and the additional first output.

8. The system of claim 1, wherein the one or more first detectors comprise one or more two-dimensional detectors.

9. The system of claim 1, wherein the control subsystem is further configured for determining the one or more characteristics of the light using a tomographic technique and an optical model of the optical system.

10. The system of claim 1, wherein the one or more characteristics comprise a spatial incident intensity distribution within an illumination field at the specimen.

11. The system of claim 1, wherein determining the one or more characteristics includes determining a three-dimensional spatial incident intensity distribution of the light source and determining the one or more characteristics at the specimen from the three-dimensional spatial incident intensity distribution.

12. The system of claim 1, wherein the one or more characteristics comprise one or more spatial and temporal characteristics.

13. The system of claim 1, wherein the control subsystem is further configured for altering one or more parameters of the optical system based on the determined one or more characteristics.

14. The system of claim 1, wherein the control subsystem is further configured for outputting the determined one or more characteristics to a computer subsystem of the optical system, and wherein the computer subsystem is configured for altering one or more parameters of the optical system based on the determined one or more characteristics.

15. The system of claim 1, further comprising one or more calibration detectors configured for detecting the light collected at the one or more second angles and directed to the specimen by the optical system, wherein the control subsystem is further configured for calibrating the output of the one or more first detectors based on the light detected by the one or more calibration detectors.

16. The system of claim 1, wherein the light is extreme ultraviolet light.

17. The system of claim 1, wherein the light is vacuum ultraviolet light.

18. The system of claim 1, wherein the light is soft x-rays.

19. The system of claim 1, wherein the specimen is a reticle.

20. The system of claim 1, wherein the specimen is a wafer.

21. The system of claim 1, wherein the optical system is configured as an inspection system.

22. The system of claim 1, wherein the optical system is configured as a metrology system.

23. The system of claim 1, wherein the optical system is configured as a defect review system.

24. The system of claim 1, wherein the optical system is configured as a lithography tool.

25. A system configured for determining information for a specimen, comprising:
   a light source configured for generating light having one or more wavelengths shorter than 190 nm;
   one or more first detectors configured to detect the light emitted from the light source at one or more first angles and to generate first output responsive to the light detected by the one or more first detectors;
   one or more second optical elements configured to collect the light emitted from the light source at one or more second angles mutually exclusive of the one or more first angles, to direct the light collected at the one or more second angles to a specimen, and to direct the light from the specimen to one or more second detectors configured to generate second output responsive to the light from the specimen, wherein the light detected by the one or more first detectors is not acted upon by any of the one or more second optical elements that collect and direct the light from the light source to the specimen;
   a computer subsystem configured to determine information for the specimen based on the second output; and
   a control subsystem configured for determining one or more characteristics of the light at one or more planes in the path of the light collected at the one or more second angles based on the first output and for altering at least one of one or more parameters of the light source, one or more parameters of the one or more second optical elements, one or more parameters of the one or more second detectors, and one or more parameters used by the computer subsystem to determine the information based on the determined one or more characteristics.

26. A non-transitory computer-readable medium, storing program instructions executable on a computer system for performing a computer-implemented method for determining one or more characteristics of light in an optical system, wherein the computer-implemented method comprises:
   detecting light having one or more wavelengths shorter than 190 nm emitted from a light source at one or more first angles with one or more first detectors that generate first output responsive to the light detected by the one or more first detectors, wherein the one or more first angles are mutually exclusive of one or more second angles at which the light is collected from the light source by an optical system for illumination of a specimen, and wherein the light detected by the one or more first detectors is not acted upon by any optical elements that collect and direct the light from the light source to the specimen; and
   determining one or more characteristics of the light at one or more planes in the optical system based on the first output.

27. A method for determining one or more characteristics of light in an optical system, comprising:
   detecting light having one or more wavelengths shorter than 190 nm emitted from a light source at one or more first angles with one or more first detectors that generate first output responsive to the light detected by the one or more first detectors, wherein the one or more first angles are mutually exclusive of one or more second angles at which the light is collected from the light source by an optical system for illumination of a specimen, and wherein the light detected by the one or more first detectors is not acted upon by any optical elements that collect and direct the light from the light source to the specimen; and
   determining one or more characteristics of the light at one or more planes in the optical system based on the first output.

* * * * *